United States Patent
Hoehenberger et al.

(10) Patent No.: US 12,169,178 B2
(45) Date of Patent: Dec. 17, 2024

(54) IC FABRICATION FLOW WITH DYNAMIC SAMPLING FOR MEASUREMENT

(71) Applicant: TEXAS INSTRUMENTS INCORPORATED, Dallas, TX (US)

(72) Inventors: Jonas Hoehenberger, Kissing (DE); Moritz Steinberg, Freising (DE); Pietro Foglietti, Altdorf (DE); Alexander Sirch, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 86 days.

(21) Appl. No.: 17/955,706

(22) Filed: Sep. 29, 2022

(65) Prior Publication Data

US 2023/0366832 A1 Nov. 16, 2023

Related U.S. Application Data

(60) Provisional application No. 63/341,502, filed on May 13, 2022.

(51) Int. Cl.
*G01N 21/95* (2006.01)
*G03F 7/00* (2006.01)

(52) U.S. Cl.
CPC ......... *G01N 21/9501* (2013.01); *G03F 7/705* (2013.01); *G03F 7/70633* (2013.01)

(58) Field of Classification Search
CPC ............... G03F 7/705; G03F 7/70633; G03F 7/706833; G01N 21/9501; H01L 22/12; H01L 22/14; H01L 22/20
See application file for complete search history.

(56) References Cited

U.S. PATENT DOCUMENTS

2022/0197151 A1\* 6/2022 Mehta ................ G03F 7/70591

FOREIGN PATENT DOCUMENTS

| TW | 1749386 B | \* | 12/2021 | ............ G06F 7/705 |
| WO | WO-2021197730 A1 | \* | 10/2021 | ............ G03F 7/705 |

\* cited by examiner

*Primary Examiner* — Peter B Kim
(74) *Attorney, Agent, or Firm* — Andrew R. Ralston; Frank D. Cimino

(57) ABSTRACT

A wafer metrology system including a dynamic sampling scheme configured to optimize a sampling rate for measurement of process wafers in an IC fabrication flow based on process capability index data as well as measurement history data. For a stable process, the process wafers may be sampled at a lower rate without negatively affecting quality control.

18 Claims, 12 Drawing Sheets

| CPK VALUE | SIGMA | SAMPLE RATE | SAMPLE RATE % |
|---|---|---|---|
| CPk => 2.33 | 7s | 1 RUN OVER 2 RUNS | 50% |
| 2.33 > CPk => 2.0 | 6s | 2 RUNS OVER 3 RUNS | 67% |
| 2 > CPk => 1.85 | 5.5s | 3 RUNS OVER 4 RUNS | 75% |
| 1.85 > CPk => 1.67 | 5s | 4 RUNS OVER 5 RUNS | 80% |
| 1.67 > CPk | <5s | 5 RUNS OVER 5 RUNS | 100% |

| CASE | SAMPLEDRUN-4 | SAMPLEDRUN-3 | SAMPLEDRUN-2 | SAMPLEDRUN-1 |
|------|--------------|--------------|--------------|--------------|
| 1 | 0 | 0 | 0 | 0 |
| 2 | 1 | 0 | 0 | 0 |
| 3 | 0 | 1 | 0 | 0 |
| 4 | 1 | 1 | 0 | 0 |
| 5 | 0 | 0 | 1 | 0 |
| 6 | 1 | 1 | 1 | 0 |
| 7 | 0 | 1 | 1 | 0 |
| 8 | 1 | 1 | 1 | 0 |
| 9 | 0 | 0 | 0 | 1 |
| 10 | 1 | 1 | 0 | 1 |
| 11 | 0 | 0 | 1 | 1 |
| 12 | 1 | 1 | 1 | 1 |
| 13 | 0 | 0 | 1 | 1 |
| 14 | 1 | 1 | 1 | 1 |
| 15 | 0 | 1 | 1 | 1 |
| 16 | 1 | 1 | 1 | 1 |

FIG. 4B 400C-1

| CASE | SAMPLED RUN-4 | SAMPLED RUN-3 | SAMPLED RUN-2 | SAMPLED RUN-1 | CPk VALUE | CPk CASE | RATE LOTS TO MEASURE | CURRENT LOT TO BE MEASURED? |
|---|---|---|---|---|---|---|---|---|
| 1 | 0 | 0 | 0 | 0 | CPk < 1.67 | 1 | 5 OVER 5 | YES |
| 2 | 1 | 0 | 0 | 0 | CPk < 1.67 | 1 | 5 OVER 5 | YES |
| 3 | 0 | 1 | 0 | 0 | CPk < 1.67 | 1 | 5 OVER 5 | YES |
| 4 | 1 | 1 | 0 | 0 | CPk < 1.67 | 1 | 5 OVER 5 | YES |
| 5 | 0 | 0 | 1 | 1 | CPk < 1.67 | 1 | 5 OVER 5 | YES |
| 6 | 1 | 0 | 1 | 1 | CPk < 1.67 | 1 | 5 OVER 5 | YES |
| 7 | 0 | 1 | 1 | 1 | CPk < 1.67 | 1 | 5 OVER 5 | YES |
| 8 | 1 | 1 | 1 | 1 | CPk < 1.67 | 1 | 5 OVER 5 | YES |
| 9 | 0 | 0 | 0 | 0 | CPk < 1.67 | 1 | 5 OVER 5 | YES |
| 10 | 1 | 0 | 0 | 0 | CPk < 1.67 | 1 | 5 OVER 5 | YES |
| 11 | 0 | 1 | 0 | 0 | CPk < 1.67 | 1 | 5 OVER 5 | YES |
| 12 | 1 | 1 | 0 | 0 | CPk < 1.67 | 1 | 5 OVER 5 | YES |
| 13 | 0 | 0 | 1 | 1 | CPk < 1.67 | 1 | 5 OVER 5 | YES |
| 14 | 1 | 0 | 1 | 1 | CPk < 1.67 | 1 | 5 OVER 5 | YES |
| 15 | 0 | 1 | 1 | 1 | CPk < 1.67 | 1 | 5 OVER 5 | YES |
| 16 | 1 | 1 | 1 | 1 | CPk < 1.67 | 1 | 5 OVER 5 | YES |

FROM FIG. 4C-1 — TO FIG. 4C-3

| | | | | | | | |
|---|---|---|---|---|---|---|---|
| 17 | 0 | 0 | 0 | 0 | 1.67 <= CPk < 1.835 | 2 | 4 OVER 5 | YES |
| 18 | 1 | 0 | 0 | 0 | 1.67 <= CPk < 1.835 | 2 | 4 OVER 5 | YES |
| 19 | 0 | 1 | 0 | 0 | 1.67 <= CPk < 1.835 | 2 | 4 OVER 5 | YES |
| 20 | 1 | 1 | 0 | 0 | 1.67 <= CPk < 1.835 | 2 | 4 OVER 5 | YES |
| 21 | 0 | 0 | 1 | 1 | 1.67 <= CPk < 1.835 | 2 | 4 OVER 5 | YES |
| 22 | 1 | 1 | 1 | 1 | 1.67 <= CPk < 1.835 | 2 | 4 OVER 5 | YES |
| 23 | 0 | 1 | 1 | 1 | 1.67 <= CPk < 1.835 | 2 | 4 OVER 5 | YES |
| 24 | 1 | 1 | 0 | 0 | 1.67 <= CPk < 1.835 | 2 | 4 OVER 5 | YES |
| 25 | 0 | 0 | 0 | 0 | 1.67 <= CPk < 1.835 | 2 | 4 OVER 5 | YES |
| 26 | 1 | 1 | 1 | 0 | 1.67 <= CPk < 1.835 | 2 | 4 OVER 5 | YES |
| 27 | 0 | 0 | 1 | 1 | 1.67 <= CPk < 1.835 | 2 | 4 OVER 5 | YES |
| 28 | 1 | 0 | 1 | 1 | 1.67 <= CPk < 1.835 | 2 | 4 OVER 5 | YES |
| 29 | 0 | 1 | 0 | 1 | 1.67 <= CPk < 1.835 | 2 | 4 OVER 5 | YES |
| 30 | 1 | 0 | 1 | 1 | 1.67 <= CPk < 1.835 | 2 | 4 OVER 5 | YES |
| 31 | 0 | 1 | 1 | 1 | 1.67 <= CPk < 1.835 | 2 | 4 OVER 5 | YES |
| 32 | 1 | 1 | 1 | 1 | 1.67 <= CPk < 1.835 | 2 | 4 OVER 5 | NO |

FROM FIG. 4C-2 / TO FIG. 4C-4

| | | | | | | | |
|---|---|---|---|---|---|---|---|
| 33 | 0 | 0 | 0 | 0 | 1.835 <= CPk < 2.00 | 3 | 3 OVER 4 | YES |
| 34 | 1 | 0 | 0 | 0 | 1.835 <= CPk < 2.00 | 3 | 3 OVER 4 | YES |
| 35 | 0 | 1 | 0 | 0 | 1.835 <= CPk < 2.00 | 3 | 3 OVER 4 | YES |
| 36 | 1 | 1 | 0 | 0 | 1.835 <= CPk < 2.00 | 3 | 3 OVER 4 | YES |
| 37 | 0 | 0 | 1 | 1 | 1.835 <= CPk < 2.00 | 3 | 3 OVER 4 | YES |
| 38 | 1 | 1 | 1 | 1 | 1.835 <= CPk < 2.00 | 3 | 3 OVER 4 | YES |
| 39 | 0 | 1 | 1 | 1 | 1.835 <= CPk < 2.00 | 3 | 3 OVER 4 | YES |
| 40 | 1 | 0 | 0 | 0 | 1.835 <= CPk < 2.00 | 3 | 3 OVER 4 | YES |
| 41 | 0 | 1 | 0 | 0 | 1.835 <= CPk < 2.00 | 3 | 3 OVER 4 | YES |
| 42 | 1 | 1 | 0 | 0 | 1.835 <= CPk < 2.00 | 3 | 3 OVER 4 | YES |
| 43 | 0 | 0 | 1 | 1 | 1.835 <= CPk < 2.00 | 3 | 3 OVER 4 | YES |
| 44 | 1 | 0 | 1 | 1 | 1.835 <= CPk < 2.00 | 3 | 3 OVER 4 | YES |
| 45 | 0 | 1 | 1 | 1 | 1.835 <= CPk < 2.00 | 3 | 3 OVER 4 | YES |
| 46 | 1 | 1 | 1 | 1 | 1.835 <= CPk < 2.00 | 3 | 3 OVER 4 | YES |
| 47 | 0 | 0 | 0 | 0 | 1.835 <= CPk < 2.00 | 3 | 3 OVER 4 | NO |
| 48 | 1 | 1 | 1 | 1 | 1.835 <= CPk < 2.00 | 3 | 3 OVER 4 | NO |

400C-4

| | | | | | | | |
|---|---|---|---|---|---|---|---|
| 49 | 0 | 0 | 0 | 0 | 2.00 <= CPk < 2.33 | 4 | 2 OVER 3 | YES |
| 50 | 1 | 0 | 0 | 0 | 2.00 <= CPk < 2.33 | 4 | 2 OVER 3 | YES |
| 51 | 0 | 1 | 0 | 0 | 2.00 <= CPk < 2.33 | 4 | 2 OVER 3 | YES |
| 52 | 1 | 1 | 0 | 0 | 2.00 <= CPk < 2.33 | 4 | 2 OVER 3 | YES |
| 53 | 0 | 0 | 1 | 1 | 2.00 <= CPk < 2.33 | 4 | 2 OVER 3 | YES |
| 54 | 1 | 0 | 1 | 1 | 2.00 <= CPk < 2.33 | 4 | 2 OVER 3 | YES |
| 55 | 0 | 1 | 1 | 1 | 2.00 <= CPk < 2.33 | 4 | 2 OVER 3 | YES |
| 56 | 1 | 1 | 0 | 0 | 2.00 <= CPk < 2.33 | 4 | 2 OVER 3 | YES |
| 57 | 0 | 0 | 0 | 0 | 2.00 <= CPk < 2.33 | 4 | 2 OVER 3 | YES |
| 58 | 1 | 0 | 0 | 0 | 2.00 <= CPk < 2.33 | 4 | 2 OVER 3 | YES |
| 59 | 0 | 1 | 1 | 1 | 2.00 <= CPk < 2.33 | 4 | 2 OVER 3 | YES |
| 60 | 1 | 0 | 1 | 1 | 2.00 <= CPk < 2.33 | 4 | 2 OVER 3 | NO |
| 61 | 0 | 0 | 1 | 1 | 2.00 <= CPk < 2.33 | 4 | 2 OVER 3 | NO |
| 62 | 1 | 1 | 1 | 1 | 2.00 <= CPk < 2.33 | 4 | 2 OVER 3 | NO |
| 63 | 0 | 0 | 1 | 1 | 2.00 <= CPk < 2.33 | 4 | 2 OVER 3 | NO |
| 64 | 1 | 1 | 1 | 1 | 2.00 <= CPk < 2.33 | 4 | 2 OVER 3 | NO |

FROM FIG. 4C-3

| | | | | | | | | |
|---|---|---|---|---|---|---|---|---|
| 65 | 0 | 0 | 0 | 0 | CPk => 2.33 | 5 | 1 OVER 2 | YES |
| 66 | 1 | 0 | 0 | 0 | CPk => 2.33 | 5 | 1 OVER 2 | YES |
| 67 | 0 | 1 | 0 | 0 | CPk => 2.33 | 5 | 1 OVER 2 | YES |
| 68 | 1 | 1 | 0 | 0 | CPk => 2.33 | 5 | 1 OVER 2 | YES |
| 69 | 0 | 0 | 1 | 1 | CPk => 2.33 | 5 | 1 OVER 2 | YES |
| 70 | 1 | 0 | 1 | 1 | CPk => 2.33 | 5 | 1 OVER 2 | YES |
| 71 | 0 | 1 | 1 | 1 | CPk => 2.33 | 5 | 1 OVER 2 | YES |
| 72 | 1 | 1 | 1 | 1 | CPk => 2.33 | 5 | 1 OVER 2 | YES |
| 73 | 0 | 0 | 0 | 0 | CPk => 2.33 | 5 | 1 OVER 2 | NO |
| 74 | 1 | 0 | 0 | 0 | CPk => 2.33 | 5 | 1 OVER 2 | NO |
| 75 | 0 | 1 | 0 | 0 | CPk => 2.33 | 5 | 1 OVER 2 | NO |
| 76 | 1 | 1 | 1 | 1 | CPk => 2.33 | 5 | 1 OVER 2 | NO |
| 77 | 0 | 0 | 1 | 1 | CPk => 2.33 | 5 | 1 OVER 2 | NO |
| 78 | 1 | 0 | 1 | 1 | CPk => 2.33 | 5 | 1 OVER 2 | NO |
| 79 | 0 | 1 | 1 | 1 | CPk => 2.33 | 5 | 1 OVER 2 | NO |
| 80 | 1 | 1 | 1 | 1 | CPk => 2.33 | 5 | 1 OVER 2 | NO |

FIG. 4C-5

| CASE | SAMPLED RUN-4 | SAMPLED RUN-3 | SAMPLED RUN-2 | SAMPLED RUN-1 | LAST4 SUM | LAST3 SUM | LAST2 SUM | LAST1 SUM | CPk VALUE | CPk CASE | RATE LOTS TO MEASURE | CURRENT LOT TO BE MEASURED? |
|---|---|---|---|---|---|---|---|---|---|---|---|---|
| 32 | 1 | 1 | 1 | 1 | 4 | 3 | 2 | 1 | 1.67 <= CPk < 1.835 | 2 | 4 OVER 5 | NO |
| 47 | 0 | 1 | 1 | 1 | 3 | 3 | 2 | 1 | 1.835 <= CPk < 2.00 | 3 | 3 OVER 4 | NO |
| 48 | 1 | 1 | 1 | 1 | 4 | 3 | 2 | 1 | 1.835 <= CPk < 2.00 | 3 | 3 OVER 4 | NO |
| 61 | 0 | 0 | 1 | 1 | 2 | 2 | 2 | 1 | 2.00 <= CPk < 2.33 | 4 | 2 OVER 3 | NO |
| 62 | 1 | 0 | 1 | 1 | 3 | 2 | 2 | 1 | 2.00 <= CPk < 2.33 | 4 | 2 OVER 3 | NO |
| 63 | 0 | 1 | 1 | 1 | 3 | 3 | 2 | 1 | 2.00 <= CPk < 2.33 | 4 | 2 OVER 3 | NO |
| 64 | 1 | 1 | 1 | 1 | 4 | 3 | 2 | 1 | 2.00 <= CPk < 2.33 | 4 | 2 OVER 3 | NO |
| 73 | 0 | 0 | 0 | 1 | 1 | 1 | 1 | 1 | CPk => 2.33 | 5 | 1 OVER 2 | NO |
| 74 | 1 | 0 | 0 | 1 | 2 | 1 | 1 | 1 | CPk => 2.33 | 5 | 1 OVER 2 | NO |
| 75 | 0 | 1 | 0 | 1 | 2 | 2 | 1 | 1 | CPk => 2.33 | 5 | 1 OVER 2 | NO |
| 76 | 1 | 1 | 0 | 1 | 3 | 2 | 1 | 1 | CPk => 2.33 | 5 | 1 OVER 2 | NO |
| 77 | 0 | 0 | 1 | 1 | 2 | 2 | 2 | 1 | CPk => 2.33 | 5 | 1 OVER 2 | NO |
| 78 | 1 | 0 | 1 | 1 | 3 | 2 | 2 | 1 | CPk => 2.33 | 5 | 1 OVER 2 | NO |
| 79 | 0 | 1 | 1 | 1 | 3 | 3 | 2 | 1 | CPk => 2.33 | 5 | 1 OVER 2 | NO |
| 80 | 1 | 1 | 1 | 1 | 4 | 3 | 2 | 1 | CPk => 2.33 | 5 | 1 OVER 2 | NO |

IC FABRICATION FLOW WITH DYNAMIC SAMPLING FOR MEASUREMENT

CROSS-REFERENCE TO RELATED APPLICATIONS

This non-provisional application claims priority based upon U.S. provisional Application No. 63/341,502, filed May 13, 2022, which is hereby incorporated by reference in its entirety.

FIELD OF THE DISCLOSURE

Disclosed implementations relate generally to the field of semiconductor fabrication using statistical quality control. More particularly, but not exclusively, the disclosed implementations relate to an IC fabrication flow using dynamic sampling for measurement.

BACKGROUND

Within the semiconductor industry, there is a constant demand for integrated circuits (ICs) that exhibit higher performance at a lower cost. In order to design and manufacture high performance ICs cost-effectively, several parameters of the products flowing through a manufacturing process, e.g., process wafers, semiconductor dies, etc., need to be monitored and carefully controlled. For example, film properties, thicknesses, linewidths, and defect levels need to be measured, first to optimize the manufacturing process, and then subsequently to ensure that it is operating under control.

Wafer metrology tools may be combined with wafer inspection capabilities so as to ensure that appropriate physical and electrical properties of semiconductor devices under production are maintained. Whereas cost-effective wafer metrology is a necessity in modern semiconductor IC fabrication, inspecting and monitoring wafers is not without associated costs. Example costs may typically include capital outlays for the inspection/metrology equipment as well as manufacturing costs such as, e.g., time spent on inspection itself, which slows down wafer throughput; establishment of separate metrology stations for performing measurements; processing the measurement data; verifying results and dispositioning wafer lots; and the like.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

Examples of the present disclosure are directed to a dynamic sampling scheme configured to optimize sampling rates for the measurement of process wafers in an IC fabrication flow based on process capability index data as well as measurement history. In some example arrangements, the process wafers may be sampled at a lower rate or even skipped for a stable process without negatively affecting quality control.

In one example, a method of fabricating an IC is disclosed. The method may include processing a current plurality of semiconductor wafers in a fabrication flow having a sequence of process steps including a targeted process step, wherein the targeted process step adds to or subtracts from a material layer over the semiconductor wafers. The method may include performing a metrological operation with respect to a measurement parameter associated with the material layer. In one arrangement, the metrological operation may be performed responsive to a determination that the current plurality of semiconductor wafers is selected for measurement at the targeted process step, the determination based on a process capability index associated with the measurement parameter and a measurement history of a plurality of previous process runs at the targeted process step, each previous process run comprising a corresponding plurality of semiconductor wafers. Responsive to determining that the metrological operation identifies at least one semiconductor wafer of the current plurality of semiconductor wafers as having an out-of-specification measurement, one or more processing conditions of the targeted process step may be adjusted. Further, at least one semiconductor wafer containing the IC may be processed using the targeted process step after the adjustment. In one arrangement, after completing the sequence of process steps, including the targeted process step, at least one semiconductor die containing the IC may be singulated for packaging.

In another example, a method of fabricating articles of manufacture is disclosed. The method may include processing a current metrological sampling unit (MSU) of the articles in a process flow having a sequence of process steps including a targeted process step. In one arrangement, the current MSU may contain a single article of manufacture. In some arrangements, the MSU may contain a group of articles of manufacture. The method may include performing a metrological operation with respect to a measurement parameter associated with the targeted process step. In one arrangement, the metrological operation may be performed responsive to a determination that the current MSU is selected for measurement at the targeted process step, the determination based on a process capability index associated with the measurement parameter and a measurement history of a plurality of previous MSUs at the targeted process step. Responsive to the condition that the metrological operation identifies the current MSU as having an out-of-specification measurement, the method may include determining that the current MSU is reworkable and adjusting one or more processing conditions of the targeted process step in response. Thereafter, the current MSU may be processed using the targeted process step after the adjustment.

In another example, an IC is disclosed, which comprises a material layer formed over a semiconductor wafer at a targeted process step of a fabrication flow, the semiconductor wafer forming a substrate for the IC. In one arrangement, the material layer may be reworked responsive to a condition that a metrological operation with respect to a measurement parameter associated with the material layer identifies the semiconductor wafer as having an out-of-specification measurement, wherein the metrological operation may be performed on one or more die locations of the semiconductor wafer according to a measurement plan. In one arrangement, the metrological operation may be performed responsive to a determination that the semiconductor wafer is selected for measurement at the targeted process step, the determination based on a process capability index associated with the measurement parameter and a measurement history of a plurality of semiconductor wafers processed at the targeted process step.

BRIEF DESCRIPTION OF THE DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

FIG. 4A to FIG. 4C-5 depict examples of process capability index data, measurement history data and a sampling decision database in an implementation of a decision engine according to a representative example of the present disclosure; and FIG. 5 depicts a subset of an example sampling decision database identifying a plurality of scenarios for skipping a current process run for measurement according to an implementation of a decision engine in a representative example of the present disclosure.

DETAILED DESCRIPTION

Figure 1:
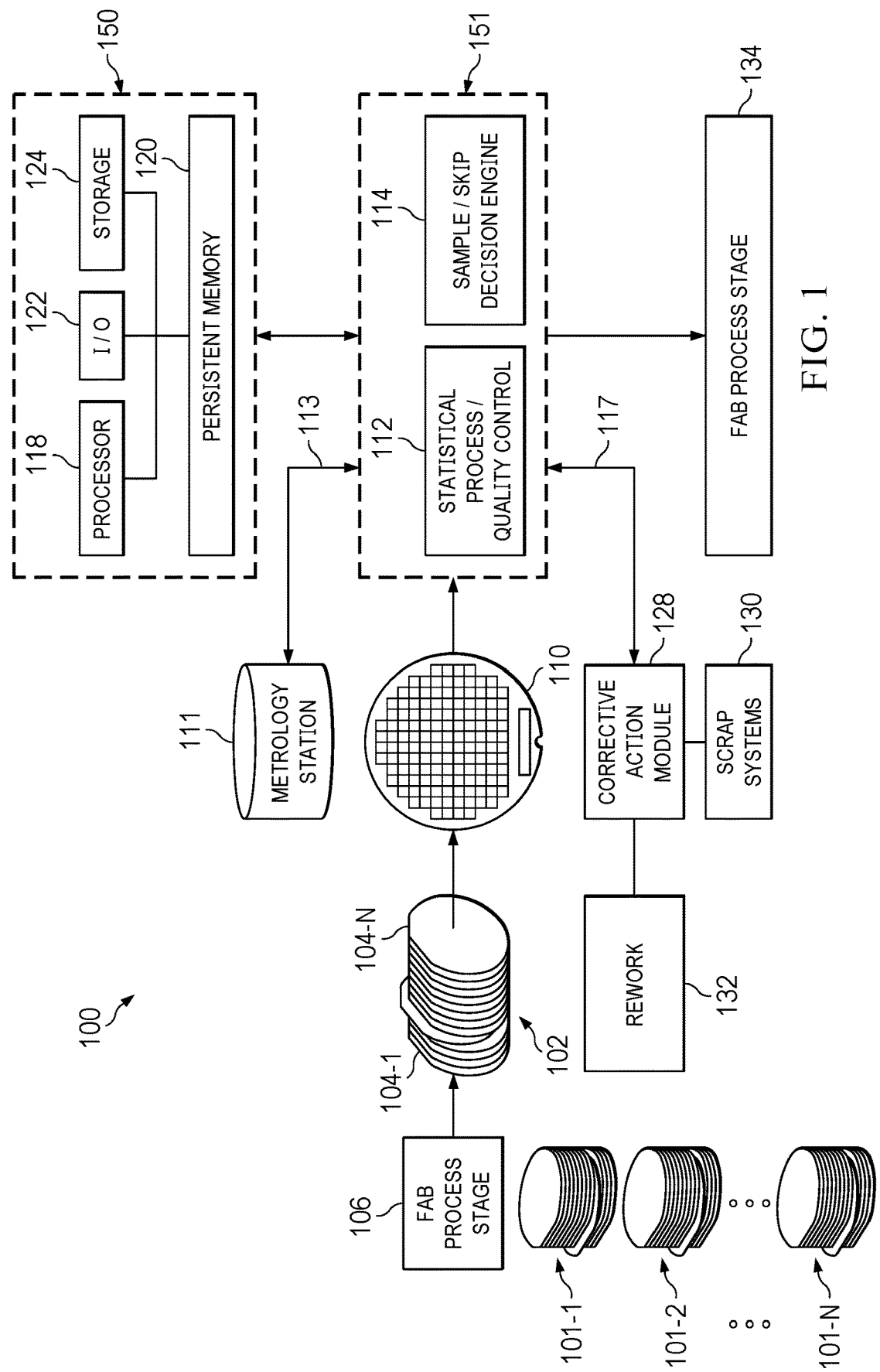
FIG. 1 depicts a representative wafer metrology system that may be deployed in association with one or more process stages of a wafer fabrication flow according to some examples of the present disclosure.

Examples of the disclosure are described with reference to the attached Figures wherein like reference numerals are generally utilized to refer to like elements. The Figures are not drawn to scale and they are provided merely to illustrate examples. Numerous specific details, relationships, and methods are set forth below to provide an understanding of one or more examples. However, it should be understood that some examples may be practiced without such specific details. In other instances, well-known subsystems, components, structures and techniques have not been shown in detail in order not to obscure the understanding of the examples. Accordingly, it will be appreciated by one skilled in the art that the examples of the present disclosure may be practiced without such specific components, structures or subsystems, etc.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. "Directly connected" may be used to convey that two or more physical features touch, or share an interface between each other. Further, in one or more examples set forth herein, generally speaking, an element, component or module may be configured to perform a function if the element may be programmed for performing or otherwise structurally arranged to perform that function.

Without limitation, examples relating to dynamic sampling of units, products, or more generally, articles of manufacture, for measurement will be set forth below in the context of semiconductor wafer fabrication.

Depending on implementation, a semiconductor manufacturing process may comprise a fabrication flow involving one or more thin-film and/or thick-film processing/deposition stages, one or more photolithography stages, implant stages, etching stages, chemical-mechanical polishing (CMP) stages, metallization stages, etc., among others, wherein a plurality of semiconductor wafers may be processed on a wafer-by wafer basis, on a lot-by-lot basis, or in a batch mode involving a number of wafer lots or process runs. At an example process stage, a material layer of the semiconductor wafer may be processed so as to alter one or more physical and/or electrical characteristics of the material layer. In some examples, a process stage may add to or subtract from a material layer, e.g., deposition of conductive layers, nonconductive or dielectric layers, etching or polishing of layers, and the like. In an example arrangement, one or more process steps or stages may be selected, monitored, or otherwise targeted for a metrological operation involving appropriate instrumentation, wherein one or more parameters relating to a material layer may be measured according to a measurement plan configured to determine, identify or otherwise select one or more die locations of a wafer or a subset of wafers of a wafer lot selected for measurement according to a sampling decision process as will be set forth further below in detail.

In some arrangements, one or more statistical process control (SPC) or statistical quality control (SQC) methodologies may be deployed in a fabrication facility in order to monitor and control a process flow at various stages. In some arrangements, example SPC/SQC methodologies may be deployed at a targeted process stage considered to be a critical process stage so as to help ensure that the targeted process stage is operating efficiently and within control, thereby producing more conforming products with less waste (e.g., rework, scrap or other disposition). For example, process wafers, wafer lots, and/or process runs may be monitored to confirm that applicable control limits and/or specification thresholds are satisfied with respect to one or more measurement parameters and/or variables relevant to the material layer(s) being processed at the targeted process stage. In some arrangements, example SPC/SQC methodologies may include generating run charts, control charts, etc., as well as performing process capability analyses and/or conducting statistically designed experiments, and the like, wherein large quantities of measurement data may be produced, processed, stored, and deployed for purposes of management, monitoring and control.

Although various processes may be controlled and monitored by deploying suitable instrumentation and sampling process wafers for in situ or inline measurements, it should be appreciated that fabrication flows having a large number of process stages can generate enormous amounts of data even in implementations where the processes are considered to be stable and/or in control. Such situations may lead to inefficiencies in terms of overutilization of resources because the measurement data is generated regardless of the stability of the process. Furthermore, because the unnecessary data generation and processing e.g., due to oversampling, ends up consuming precious computational resources as well as manpower resources, overall cycle times and the productivity of a fabrication flow may be adversely impacted.

Referring to the drawings, FIG. 1 depicts a representative wafer metrology system 100 that may be deployed in association with one or more process stages of a wafer fabrication flow, wherein a dynamic sampling scheme may be executed according to some examples of the present disclosure in order to eliminate, minimize or otherwise reduce or optimize measurement operations with respect to applicable metrological sampling units (MSUs), e.g., one or more process wafers or one or more process runs (i.e., a wafer lot), that are processed at a targeted process stage of the fabrication flow. As will be seen in further detail below, some examples of the disclosure may be configured to determine whether a current MSU needs to be sampled at the targeted process stage for a metrological operation or skipped (e.g., measurements of one or more variables and parameters germane to the current MSU at the targeted process stage are eschewed). In some example implementations, such "sample or skip" determinations may be based on a measurement history of a plurality of previous process wafers or process runs as well as previous process conditions at the targeted process stage. By way of illustration, a generalized targeted process stage 106 is exemplified in FIG. 1 that may represent any front-end-of-line (FEOL) stage or a back-end-of-line (BEOL) stage of a fabrication flow, where a plurality of wafers may be batch-processed, e.g., in one or more wafer lots or process runs 101-1 to 101-N. A current wafer lot or MSU 102 comprising semiconductor process wafers 104-1 to 104-N (also referred to as semiconductor wafers, process wafers, or simply wafers) may be selected for measurement (i.e., sampled) by a suitable metrological instrumentation station 111 or skipped responsive to a determination by a decision engine or module 151 implemented in any known or heretofore unknown hardware/software/firmware architectures. In some arrangements, the decision engine 151 may be integrated with the instrumentation station 111. In some arrangements, the decision engine 151 may be deployed as a standalone apparatus. In some arrangements, the decision engine 151 may include a process control module 112 configured to generate, maintain and store various run charts, control charts, process capability indices and distributions, as well as measurement history data relative to one or more measurement parameters that may be measured by the instrumentation station 111. A sample/skip decision engine module 114 associated with the process control module 112 may be configured to execute a dynamic sampling process for generating appropriate control signals 113 to the instrumentation station 111 to allow or, alternatively, avoid measurement operations with respect to the current MSU 102 in accordance with applicable measurement plans. In one implementation, a measurement plan may be based on different granularity levels as well as aggregation levels of the measurement data collected by the instrumentation station 111, which in turn may depend on how a current MSU is deployed for measurement. Where an MSU comprises a plurality of semiconductor wafers, e.g., MSU 102, a measurement plan may be configured to determine how many semiconductor wafers are selected from the current MSU 102 (e.g., a subset thereof) as well as how many die locations per each selected process wafer are selected for measurement. Data relating to a measured parameter may be aggregated and/or averaged over the entire MSU for plotting on a control chart that tracks the data on a lot-by-lot basis in some implementations. On the other hand, if an MSU comprises a single semiconductor wafer, an example measurement plan may be based in selecting and identifying a subset of die locations of the sampled semiconductor wafer for measurement, wherein the measured parameter may be plotted on a wafer-by-wafer basis.

Skilled artisans will recognize upon reference hereto that example measurement parameters may comprise, without limitation, one or more critical dimension (CD) variables, overlay alignment variables, layer thickness variables, layer planarization variables, etch profile variables, as well as suitable electrical variables such as, e.g., sheet resistance, or other parametric electrical data, etc., which may depend on the material layer(s) of the wafers processed at a targeted process stage. Accordingly, the instrumentation station 111 may comprise a variety of measurement tools and inspection systems that may be deployed in a semiconductor fabrication facility for measuring myriad physical, chemical, electrical, mechanical and kinetic properties or characteristics of material layers and other structures formed in or over appropriate semiconductor substrates. By way of illustration, a semiconductor process wafer 110 is exemplified as a wafer under measurement/inspection for purposes of some representative arrangements herein. In some arrangements, the instrumentation station 111 and decision engine 151 may be integrated as an inline or in situ process control tooling system, wherein a computing platform 150, e.g., a workstation or a server, having one or more processors 118 coupled to a persistent memory 120 containing machine-executable code or program instructions, may be configured to effectuate measurement operations for the MSUs selected for measurement or generate appropriate control signals 113 to avoid measurement for the MSUs that are "deselected". Appropriate input/output (I/O) modules 122 and one or more storage units 124 may be provided as part of the computing platform 150 depending on implementation. In some arrangements, where the measurements with respect to a selected MSU do not satisfy applicable control limits and/or specification thresholds, appropriate corrective actions may be executed by a corrective action module 128 responsive to suitable control signals 117, which may involve identifying the wafers for scrapping or reworking as respectively indicated by blocks 130 and 132, depending on fabrication flow management strategy including cost-benefit considerations as to wafer scrap and reworking guidelines as well as the institutional knowledge and domain expertise relating to the targeted process stage. If the measurements are avoided for a current process run, e.g., MSU 102, or the wafers of the current process run are within applicable controls and specifications (after reworking where needed), the current process run (e.g. MSU 102) may proceed to a next process stage 134 of the fabrication flow.

Figure 2A:
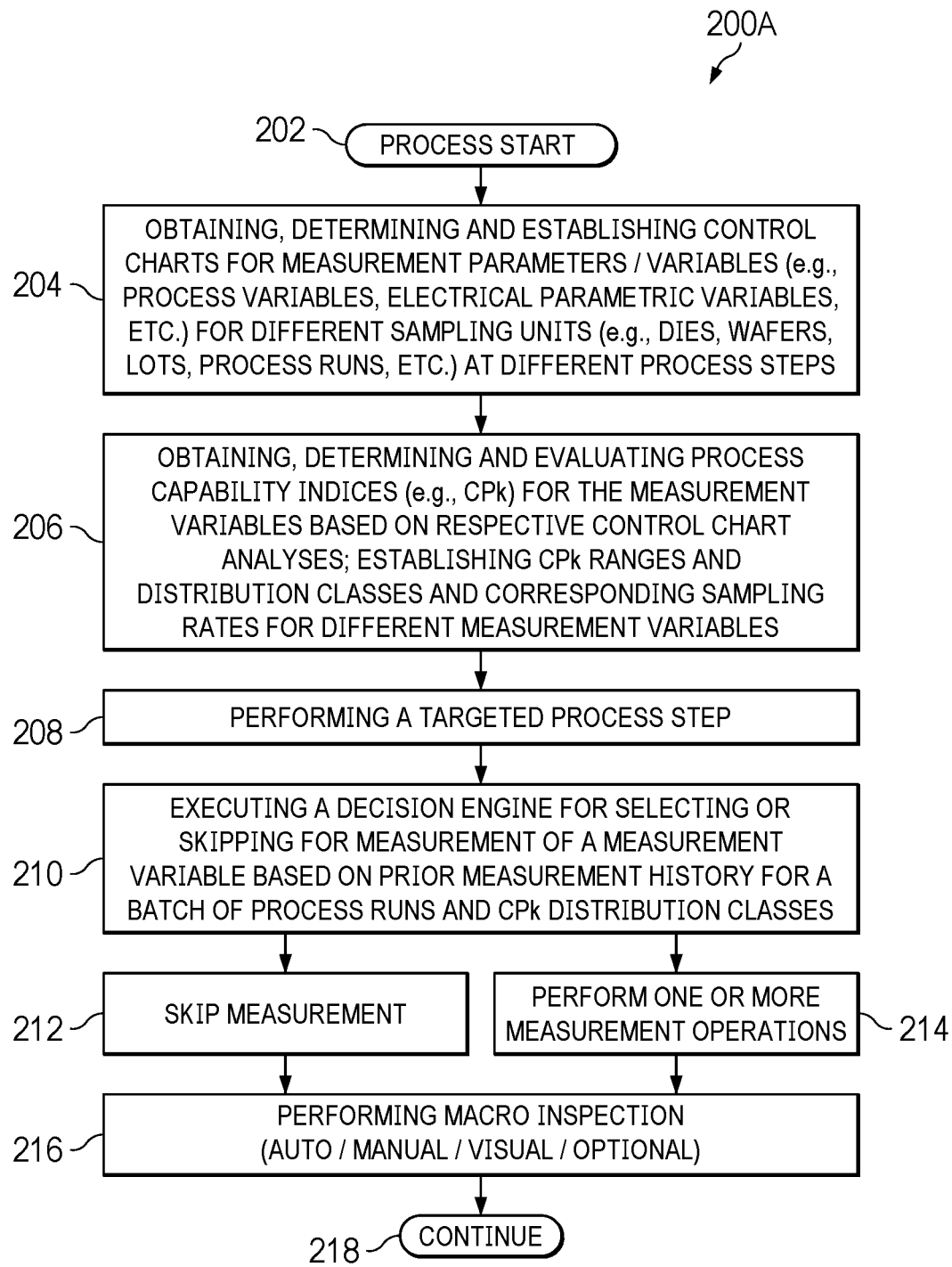
FIGS. 2A and 2B are flowcharts of representative methods according to some examples of the present disclosure.
Figure 2B:
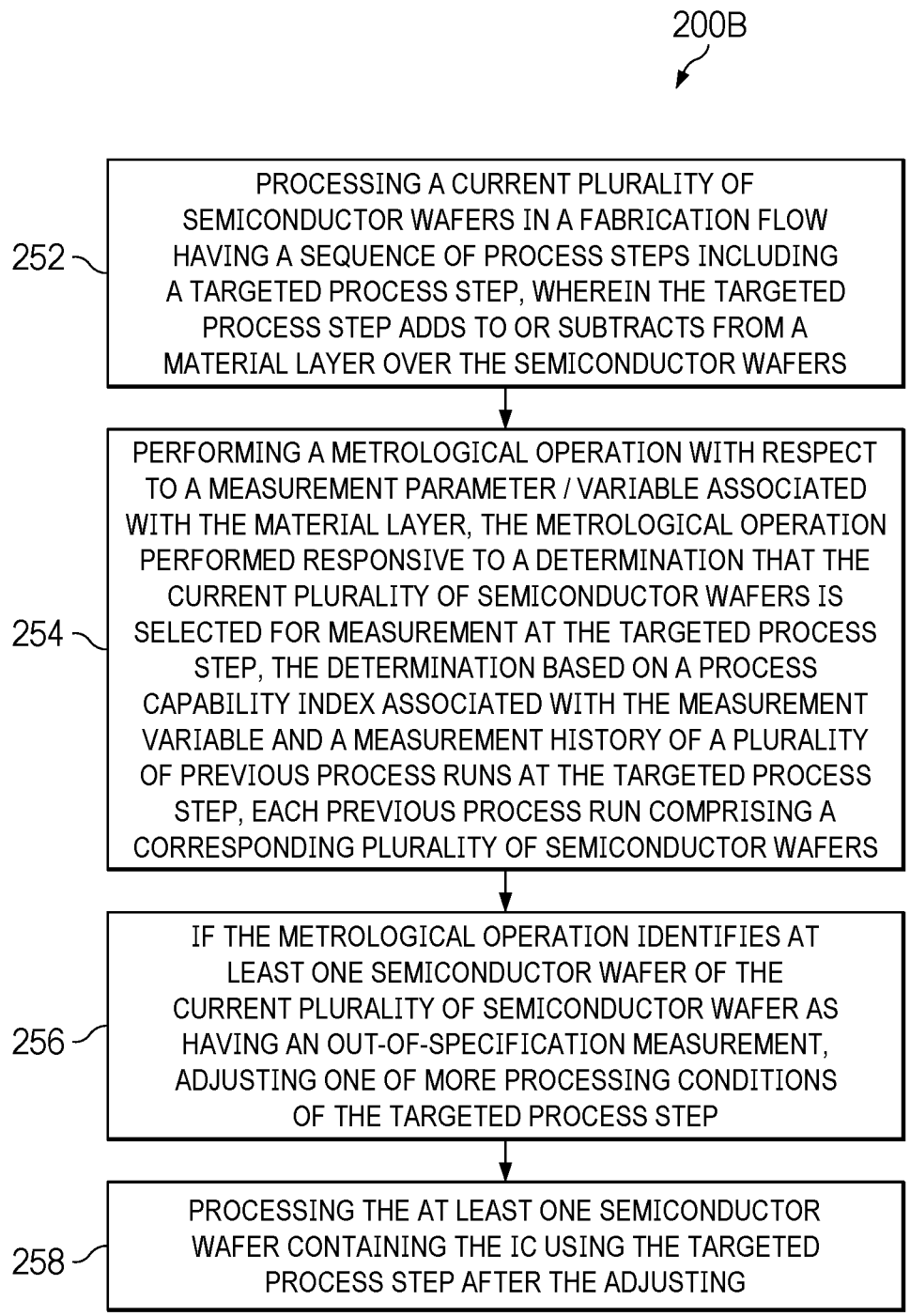

FIGS. 2A and 2B are flowcharts of representative methods according to some examples of the present disclosure. Method 200A shown in FIG. 2A is representative of an example implementation of an overall process control and sampling decision scheme that may be deployed in a wafer fabrication flow using a metrology system, e.g., system, 100, at one or more process stages, wherein process capability characterization may be performed for various process stages as part of deployment. At block 202, a process flow including a plurality of stages may be commenced. At block 204, various variables and parameters may be measured and plotted with respect to each of the process stages for applicable sampling units (e.g., dies, wafers, lots, process runs, etc.), whereby various control charts, run charts, etc. may be established. At block 206, suitable process capability indices, e.g., Cp, CPK, etc. may be obtained for different measurement parameters and variables based on the respective control chart analytics. Whereas Cp (defined as a ratio of specification width to process width) accounts for only the spread (or variation) of the process, CPK accounts for both the spread and location of the process, which is defined as a ratio between the distance from a mean value to the nearest specification limit and the distance from the mean value to the process edge. As such, CPK indices provide a more realistic description of the condition of a process for purposes of prediction and may therefore be advantageously implemented in a sampling decision scheme according to some examples herein. Further, different sampling rates may be determined based on how stable or unstable a targeted process is. In some arrangements, such determinations may be based on a process's behavior over a period of time in view of applicable control limits and specifications as captured by CPK indices, as well as whether the process is considered a critical process or not, etc. Additionally, sampling rate determinations may be based on the knowledge that higher CPK values are correlated with more stable processes (and lower out-of-control (OOC) probabilities). Accordingly, some examples may be configured with a sampling decision engine operative to determine a range of sampling rates that can afford lower values (conversely, higher skip rates) without negatively impacting the required quality assurance levels when the CPK values indicative of a stable process are used in combination with a historical measurement record over a select range of prior process runs.

At block 208, a targeted process step or stage may be performed with respect to a current process run, which may comprise any process that materially modifies the process wafers in a manner susceptible to measurement as described previously. At block 210, a decision engine may be executed for determining whether the current process run is to be sampled for measuring one or more measurement parameters (as set forth at block 214) or not (i.e., skipping measurement, as set forth at block 212). As set forth previously, measurement operations may comprise overlay measurement operations, CD measurement operations, overlay measurement operations, layer thickness measurement operations, layer planarization measurement operations, etch profile measurement operations, electrical parametric measurement operations, and the like. Some example implementations may involve further dispositioning, e.g., performing wafer-level inspection visually, manually, automatically and/or optionally, as set forth at block 216. Thereafter, method 200A may proceed to a next stage depending on the results of the measurement operations and/or further dispositioning as set forth at block 218.

Method 200B shown in FIG. 2B is representative of a method of fabricating an IC according to some examples. At block 252, a current plurality of semiconductor wafers may be processed in a fabrication flow having a sequence of process steps including a targeted process step, wherein the targeted process step adds to or subtracts from a material layer over the semiconductor wafers. At block 254, a metrological operation may be performed with respect to a measurement parameter associated with the material layer, wherein the metrological operation may be performed responsive to a determination that the current plurality of semiconductor wafers is selected for measurement at the targeted process step. In some arrangements, the selection determination may be based on executing a decision engine operable in response to a process capability index associated with the measurement parameter and a measurement history of a plurality of previous process runs at the targeted process step, wherein each previous process run comprises a corresponding plurality of semiconductor wafers. Responsive to determining the condition that the metrological operation identifies at least one semiconductor wafer of the current plurality of semiconductor wafers containing the IC as having an out-of-specification (OOS) measurement, one or more processing conditions of the targeted process step may be adjusted (block 256). In some arrangements, the at least one semiconductor wafer containing the IC may be processed in a rework operation using the targeted process step after the adjusting, as set forth at block 258.

In some additional and/or alternative arrangements, where control limits are also used in a measurement dispositioning process, an out-of-control (OOC) condition may be used as an early warning signal in an example implementation. In general, control limits are tighter than specification thresholds established for a monitored parameter, which allows for executing a variety of corrective actions including, e.g., advancing a current process run that fails to meet the control limits but satisfies the specification thresholds. In such a scenario, the current process run may be appropriately flagged for downstream inspection and dispositioning.

Figure 3:
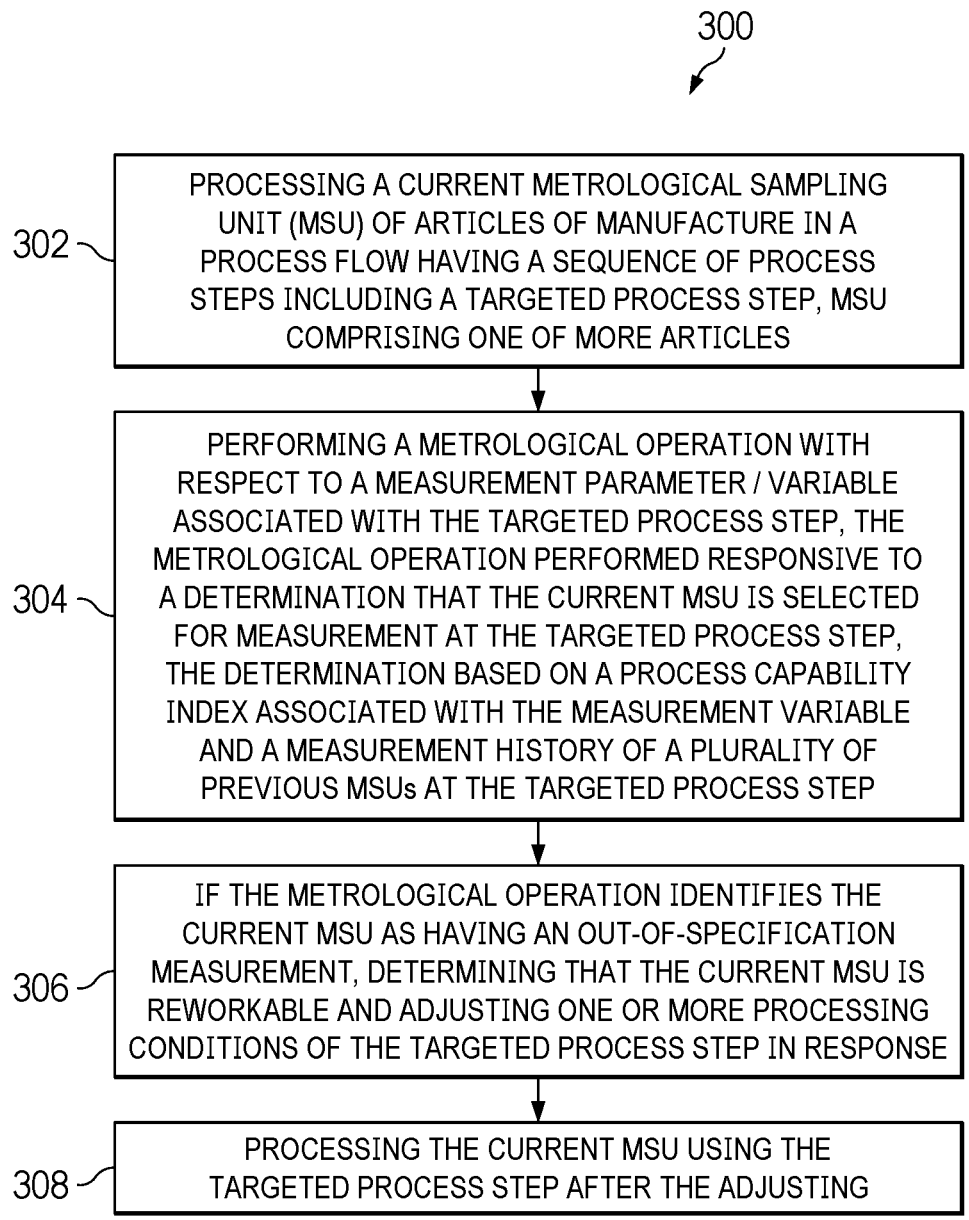
FIG. 3 is a flowchart of a generalized manufacturing flow employing dynamic sampling for measurement according to an example of the present disclosure.

FIG. 3 is a flowchart of a method of fabricating articles of manufacture in a generalized manufacturing flow employing dynamic sampling for measurement according to an example of the present disclosure. For purposes herein, "articles" may be produced by any manufacture from raw or prepared materials, wherein the materials are given new forms, qualities, properties, or combinations, in any type of industry. Depending on implementation, articles may be produced in a variety of modes, e.g., batch production, continuous production, flow production, etc., wherein a suitable MSU may comprise a single article of manufacture or a group of articles of manufacture. Example method 300 may include processing a current MSU of the articles in a process flow having a sequence of process steps including a targeted process step (block 302). At block 304, a metrological operation may be performed relative to the MSU, wherein one or more measurement parameters of the MSU associated with the targeted process step may be measured. In one arrangement, the metrological operation may be performed responsive to a determination that the current MSU is selected for measurement at the targeted process step, the determination based on a process capability index associated with the measurement parameter and a measurement history of a plurality of previous MSUs at the targeted process step. Responsive to determining the condition that the metrological operation identifies the current MSU as having an out-of-specification (OOS) measurement, a determination may be made that the current MSU is reworkable. Further, one or more processing conditions of the targeted process step may be adjusted in response. These operations are set forth at block 306. At block 308, the current MSU may be processed (e.g., reworked) using the targeted process step after the adjustment.

FIG. 4A to FIG. 4C-5 depict examples of process capability index data, measurement history data and a sampling decision database in an implementation of a decision engine according to a representative example of the present disclosure. FIG. 5 depicts a subset of an example decision database identifying a plurality of scenarios for selecting or identifying a current process run for skipping measurement according to an implementation of a decision engine in a representative example of the present disclosure. In general operation, an example decision engine may be configured to: (i) obtain an overall sampling decision database with respect to a current MSU (e.g., a process run or, simply, a run) based on the distribution of applicable process capability index ranges and the measurement history data for a set of previous MSUs; and (ii) determine a subset of possible scenarios that indicate an affirmative decision to not conduct (or, conversely, conduct) a measurement operation for the current MSU and apply the decision accordingly on the condition that one of the possible scenarios is satisfied relative to the current MSU.

An example database or structure 400A including applicable CPK index distributions and associated sampling rates is shown in FIG. 4A according to one arrangement. In one implementation, the data contained in database 400A or similar arrangement may be obtained from a process flow engineering domain having the relevant knowledge or expertise pertaining to a process being managed. A CPK index column 402 includes a range of CPK index values, where a CPK index <1.67 is considered to be indicative of a process having a low process capability (indicating a low end "goal post") and a CPk index ≥2.33 is considered to be indicative of a process having excellent capability that is greater than a 6σ process (indicating a high end "goal post"). In general, higher CPK values indicate a more capable process, thus affording correspondingly lower sampling rates (i.e., fewer runs per a given set of runs need be measured for quality assurance). Example database 400A may include a column 404 comprising standard deviation or sigma (σ) values corresponding to the range of CPK values of column 402, as well as corresponding absolute sampling rates 406 and percentage sampling rates 408 in a representative arrangement. By way of illustration, a CPK index≥2.33 is indicative of a 7σ process, where a 50% sampling rate may be applied, i.e., one out of every two runs (or, every other run) may be measured. As another illustration, for a 5.5σ process having a CPK index≥1.85 but <2.0, a sampling rate of 75% may be imposed, i.e., three runs out of four runs may be sampled for measurement. As a further illustration, the example database 400A includes a CPK index <1.67 that is indicative of a<5σ process, where a 100% sampling rate may be imposed, i.e., every run out of a given range of runs is sampled for measurement. Depending on implementation, domain expertise and process knowledge, a suitable maximum run horizon may be established, e.g., 5 runs, that can cover different sampling rates corresponding to the applicable CPK distributions of a measurement variable, which may be provided as an input to a sampling decision engine in an example arrangement. Furthermore, a measurement history corresponding to (N−1) previous runs may also be provided as an input to an example sampling decision engine, where N is the maximum run horizon and the sampling decision engine is configured to provide a sampling determination with respect to the $N^{th}$ run in a representative arrangement.

Although sampling rates 408 ranging from 50% to 100%, and corresponding CPK indices in column 402, have been illustrated in the foregoing example, different sampling rates and/or CPK index ranges may be provided in some additional and/or alternative arrangements. In general, sampling rates can vary anywhere between 0% and 100%, wherein an example lower limit may established depending on manufacturing conditions, process behavior, etc.

In an example implementation scenario involving five process runs (i.e., N=5), a measurement history corresponding to four previous process runs may be provided as a measurement pattern database, wherein four variables may be defined, each corresponding to a respective previous process run and each variable having a binary value of 1 (if a particular previous process run was measured) or 0 (if the particular previous process was not measured). By way of illustration, variable SAMPLEDRUN-1 corresponds to the process run immediately prior to the current run requiring a sampling decision (e.g., the $5^{th}$ run in the example scenario), variable SAMPLEDRUN-2 corresponds to the $2^{nd}$ process run prior to the current run, variable SAMPLEDRUN-3 corresponds to the $3^{nd}$ process run prior to the current run, and variable SAMPLEDRUN-4 corresponds to the $4^{nd}$ process run prior to the current run. FIG. 4B depicts an example measurement pattern database 400B illustrating $2^4$ combinations (=16 combinations) with respect to the history of the four previous process runs, resulting in 16 unique cases, wherein reference numerals 410-1 to 410-4 correspond to columns of binary values that respective SAMPLEDRUN-1 to SAMPLERUN-4 variables may take. By way of illustration, case 1 exemplifies a scenario where none of the four previous runs was measured and decision case 16 exemplifies a scenario where each of the four previous runs was measured, with the remaining cases representing various other combinations in between.

In one example arrangement, each of the 16 pattern cases shown in the database 400B of FIG. 4B is combined with each of the five CPK ranges or classes set forth in the CPK index column 402 of the database 400A shown in FIG. 4A, thereby resulting in 80 decision cases, wherein each decision case represents a unique combination of a specific measurement history pattern and a CPK index range. Further, for any given unique decision case, the sampling rate associated with the CPK index may be utilized in determining whether the current run needs to be sampled or not. In other words, if the sampling rate for a given case can be satisfied after including the current process run without having to measure the current run, then sampling of the current run may be skipped without negatively impacting a quality assurance protocol associated with the process. In general, the total number of unique cases in an example scenario defining an overall measurement decision space Σ is given by:

$$\Sigma = 2^{(N-1)} \{CPK\}_i, i=1,2,\ldots,p;$$

where N=number of runs in a maximum run horizon, and p=number CPK classes and/or values for a given process.

With respect to the illustrative scenario associated with the CPK index database 400A and the measurement pattern database 400B set forth above, FIGS. 4C-1 to 4C-5 cumulatively illustrate an example 80-case measurement decision database, which is partitioned into five components 400C-1 to 400C-5 shown in respective drawing Figures for convenience. As previously mentioned, a determination to measure or not the current process run is dependent on the sampling rates associated with the respective cases of the decision database, after taking into consideration the current case in the sampling rate run horizon. By way of illustrative example, decision case 16 shown in FIG. 4C-1 corresponds to a measurement history of all four previous runs having respective measurements done, wherein the process exhibits a CPK of<1.67. Because CPK<1.67 corresponds to a sampling rate of measuring each of the five runs (i.e., five runs over five runs of the run horizon), the current run that forms the $5^{th}$ run needs to be measured also. Accordingly, an example sampling decision engine may return a suitable indication (e.g., as exemplified by "Yes" in the row corresponding to decision case 16 in FIG. 4C-1), which may be provided via appropriate control signals to other process management entities including, but not limited to, a metrological station. As another example, decision case 48 shown in FIG. 4C-3 corresponds to a measurement history of all four previous runs with measurements taken, with the process having a CPK between 1.85 and 2.00 that corresponds to a sampling rate of three runs over a four-run horizon. Because the three runs immediately past the current run have all been measured, the current run that forms the $4^{th}$ run does not have to be measured in order to satisfy the requisite sampling rate. Accordingly, metrology operations for the current run may be skipped without adversely affecting applicable quality assurance requirements.

As can be seen in the example 80-case measurement decision database 400C-1 to 400C-5, a total of 15 cases indicate skipping the metrology operations for a current run. This subset of cases may be considered as a skip decision matrix 500 shown in FIG. 5. In an example arrangement, a representative decision engine may be configured with appropriate logic, e.g., comprising executable instructions implemented in hardware, software and/or firmware, or in any combination, for identifying specific conditions that give rise to a case belonging to the skip decision database in an efficient manner, whereby for any given particular set of inputs, e.g., process conditions, capability indices, sampling rates, measurement histories, a skip determination may be made advantageously without jeopardizing quality control.

In an example arrangement, an additional set of variables may be defined based on summing the values of SAMPLEDRUN-1 to SAMPLEDRUN-4 variables with respect to the cases in the skip decision database 500 for facilitating the identification of conditions giving rise to a skip decision. In one implementation, the summing variables are defined as follows:

LAST-1=SAMPLEDRUN-1
LAST-2=SUM (SAMPLEDRUN-2, SAMPLEDRUN-1)
LAST-3=SUM (SAMPLEDRUN-3, SAMPLEDRUN-2, SAMPLEDRUN-1)
LAST-4=SUM (SAMPLEDRUN-4, SAMPLEDRUN-3, SAMPLEDRUN-2, SAMPLEDRUN-1)

By way example, for decision case 32 of database 500, each of the four SAMPLEDRUN variables is 1 (indicating all four previous runs were measured. Accordingly, the corresponding LAST variables for decision case 32 are:

LAST-1=SAMPLEDRUN-1=1;
LAST-2=SUM (SAMPLEDRUN-2, SAMPLEDRUN-1) =1+1=2;
LAST-3=SUM (SAMPLEDRUN-3, SAMPLEDRUN-2, SAMPLEDRUN-1)=1+1+1=3;
LAST-4=SUM (SAMPLEDRUN-4, SAMPLEDRUN-3, SAMPLEDRUN-2, SAMPLEDRUN-1)=1+1+1+1=4

Likewise, LAST-i variables for the remaining cases may be determined depending on the respective previous run measurement data. In one arrangement, the foregoing LAST-1 to LAST-4 variables may be included in the skip decision database 500 as shown in FIG. 5 for facilitating a determination of the conditions giving rise to skipping. Appropriate logic may be executed to determine that the 15 different combinations of the skip decision database 500 may be unequivocally identified by a set of four conditions as set forth below:

CONDITION1 (CPK Case=2 AND LAST-4=4)
CONDITION2 (CPK Case=3 AND LAST-3=3)
CONDITION3 (CPK Case=4 AND LAST-2=2)
CONDITION4 (CPK Case=5 AND LAST-1=1)

It can be determined that CONDITION 1 is satisfied by just one case, decision case 32, whereas CONDITION 2 is satisfied by two cases, decision case 47 and decision case 48. In similar fashion, it can be determined that CONDITION 3 is satisfied by four cases and CONDITION 4 is satisfied by eight cases, as exemplified in FIG. 5.

In an example arrangement, appropriate conditional logic may be provided as part of a sampling decision engine to define a measurement decision variable associated with a targeted process stage. In one example arrangement, the sampling decision engine may be executed to return a value the measurement decision variable, wherein the measurement decision variable may take on a "Yes" or "No" value or other suitable discriminating indicia to indicate whether a measurement needs to be taken for the current run at the targeted process stage. In an example implementation, a KLASAMPLE variable may be defined to indicate whether a current run needs to be measured for alignment pursuant to a semiconductor process stage, wherein an example conditional decision logic may be executed as follows:

KLASAMPLE=IF (OR (CONDITION1,CONDITION2, CONDITION3,CONDITION4),0,1)

Accordingly, if any one of the CONDITION variables provided as arguments of the OR function is satisfied, KLASAMPLE may take on a value indicative of the current run skipping the alignment measurement.

Skilled artisans will appreciate that the foregoing conditional decision logic may be implemented as nested or hierarchical conditionalities in further arrangements to account for different processing conditions, special exclusions, dispositions, etc. For example, it may be desirable to avoid the execution of skip decision logic in a process that has just introduced a new reticle at a process stage because a process history has not yet been established with respect to how the new reticle performs. Accordingly, a nested conditional logic function may be executed to delay the skip decision logic execution until after a few runs (e.g., M) have been processed. Set forth below is an example logic function configured to accomplish the requisite conditional logic:

SEMSAMPLE=IF (NRET<=5,1, IF (OR (CONDITION1,CONDITION2,CONDITION3,CONDITION4),0,1))

In this case, the skip decision logic executed by the inner OR function is delayed until five process runs having the new reticle have been processed. Depending on implementation, some examples may include one or more of the following exclusions: special work requests including engineering work lots, hand carry lots (e.g., customer demonstration or demo lots with high priority samples, tool interdiction and monitoring system lots designated for special process control reasons, preventive maintenance lots, and the like.

Various disclosed methods and systems of the present disclosure may be beneficially applied to any manufacturing process to dynamically adjust the sampling rate for measurement depending on how the process is behaving, thereby help mitigate or reduce oversampling of the product flow without sacrificing applicable quality control protocols and requirements. Further, examples set forth herein may be implemented in a computationally efficient manner, leading to optimal utilization of hardware/software resources as well as human resources. While such example arrangements may be expected to provide various tangible improvements in the management of a process flow, no particular result is a requirement unless explicitly recited in a particular claim.

Moreover, although the examples have been set forth in particular detail with respect to wafer/lot measurements, the teachings of the present disclosure are not necessarily limited thereto and may be implemented in a variety of measurement scenarios in a fabrication facility, including, e.g., wafer fabrication tool maintenance measurements, wherein the decisions regarding whether a tool needs to be measured/inspected for maintenance purposes may be based on the tool's measurement history in combination with associated control charts and CPK values.

One or more examples of the present disclosure may be implemented using different combinations of software, firmware, and/or hardware. Thus, one or more of the techniques shown in the Figures (e.g., flowcharts) may be implemented using code and data stored and executed on one or more electronic devices or nodes (e.g., a workstation, a network element, etc.). Such electronic devices may store and communicate (internally and/or with other electronic devices over a network) code and data using computer-readable media, such as non-transitory computer-readable storage media (e.g., magnetic disks, optical disks, random access memory, read-only memory, flash memory devices, phase-change memory, etc.), transitory computer-readable transmission media (e.g., electrical, optical, acoustical or other form of propagated signals-such as carrier waves, infrared signals, digital signals), etc. In addition, some network elements or workstations, e.g., configured as servers, may typically include a set of one or more processors coupled to one or more other components, such as one or more storage devices (e.g., non-transitory or persistent machine-readable storage media) as well as storage database(s), user input/output devices (e.g., a keyboard, a touch screen, a pointing device, one or more imaging capturing devices and/or a display, etc.), and network connections for effectuating signaling and/or data transmission. The coupling of the set of processors and other components may be typically through one or more buses and bridges (also termed as bus controllers), arranged in any known (e.g., symmetric/shared multiprocessing) or heretofore unknown architectures. Thus, the storage device or component of a given electronic device or network element may be configured to store program code and/or data for execution on one or more processors of that element, node or electronic device for purposes of implementing one or more techniques of the present disclosure.

At least some examples are described herein with reference to one or more circuit diagrams/schematics, block diagrams and/or flowchart illustrations. It is understood that such diagrams and/or flowchart illustrations, and combinations of blocks in the block diagrams and/or flowchart illustrations, can be implemented by any appropriate circuitry configured to achieve the desired functionalities. Accordingly, some examples of the present disclosure may be embodied in hardware and/or in software (including firmware, resident software, micro-code, etc.) operating in conjunction with suitable processing units or microcontrollers, which may collectively be referred to as "circuitry," "a module" or variants thereof. An example processing unit or a module may include, by way of illustration, a general purpose processor, a special purpose processor, a conventional processor, a digital signal processor (DSP), an image processing engine or unit, a plurality of microprocessors, one or more microprocessors in association with a DSP core, a controller, a microcontroller, Application Specific Integrated Circuits (ASICs), Field Programmable Gate Array (FPGA) circuits, any other type of integrated circuit (IC), and/or a state machine, as well as programmable system devices (PSDs) employing system-on-chip (SoC) architectures that combine memory functions with programmable logic on a chip that is designed to work with a standard microcontroller. Example memory modules or storage circuitry may include volatile and/or non-volatile memories such as, e.g., random access memory (RAM), electrically erasable/programmable read-only memories (EEPROMs) or UV-EPROMS, one-time programmable (OTP) memories, Flash memories, static RAM (SRAM), etc.

Further, in at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

It should therefore be clearly understood that the order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure.

At least some portions of the foregoing description may include certain directional terminology, which may be used with reference to the orientation of some of the Figures or illustrative elements thereof being described. Because components of some examples can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. Further, the features of examples described herein may be combined with each other unless specifically noted otherwise.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the claims appended below.

What is claimed is:

1. A method of fabricating an integrated circuit (IC), the method comprising:
processing a current plurality of semiconductor wafers in a fabrication flow having a sequence of process steps including a targeted process step, wherein the targeted process step adds to or subtracts from a material layer over the semiconductor wafers;
performing a metrological operation with respect to a measurement parameter associated with the material layer, the metrological operation performed responsive to a determination that the current plurality of semiconductor wafers is selected for measurement at the targeted process step, the determination based on a process capability index associated with the measurement parameter and a measurement history of a plurality of previous process runs at the targeted process step, each previous process run comprising a corresponding plurality of semiconductor wafers, and the process capability index is distributed between a first value corresponding to a first sampling rate for sampling a batch of process runs for measurement and a second value corresponding to a second sampling rate for sampling the batch of process runs for measurement;
on the condition that the metrological operation identifies at least one semiconductor wafer of the current plurality of semiconductor wafers as having an out-of-specification measurement, adjusting one or more processing conditions of the targeted process step; and
processing at least one subsequent semiconductor wafer containing the IC using the targeted process step after the adjusting.

2. The method as recited in claim 1, wherein the metrological operation is performed on one or more semiconductor wafers of the current plurality of semiconductor wafers according to a measurement plan configured to determine a subset of semiconductor wafers from the current plurality of semiconductor wafers selected for measurement.

3. The method as recited in claim 2, wherein the measurement plan is further configured to determine a plurality of die locations per each selected semiconductor wafer of the subset of semiconductor wafers.

4. The method as recited in claim 1, wherein the measurement parameter comprises at least one of a critical dimension (CD) variable, an overlay alignment variable, a layer thickness variable, a layer planarization variable, an etch profile variable, and an electrical parametric variable.

5. The method as recited in claim 1, wherein the out-of-specification measurement is determined based on a statistical process control (SPC) history associated with the measurement parameter.

6. The method as recited in claim 1, wherein the determination that the current plurality of semiconductor wafers is selected for measurement at the targeted process step is conditionally determined upon satisfying an exclusion condition prior to executing a decision engine with respect to selecting or skipping a process run for measurement at the targeted process step.

7. The method as recited in claim 1, wherein the at least one subsequent semiconductor wafer is the at least one semiconductor wafer.

8. A method of fabricating articles of manufacture, the method comprising:
processing a current metrological sampling unit (MSU) of the articles in a process flow having a sequence of process steps including a targeted process step;
performing a metrological operation with respect to a measurement parameter associated with the targeted process step, the metrological operation performed responsive to a determination that the current MSU is selected for measurement at the targeted process step, the determination based on a process capability index associated with the measurement parameter and a measurement history of a plurality of previous MSUs at the targeted process step;
on the condition that the metrological operation identifies the current MSU as having an out-of-specification measurement, determining that the current MSU is reworkable and adjusting one or more processing conditions of the targeted process step in response; and
processing the current MSU using the targeted process step after the adjusting,
wherein the process capability index is distributed to account for variability of the measurement parameter from a first value that corresponds to a first sampling rate comprising 100% sampling wherein each MSU of a batch of MSUs is sampled for measurement and a second value that corresponds to a second sampling rate comprising 50% sampling wherein every other MSU of a batch of the MSUs is sampled for measurement.

9. The method as recited in claim 8, wherein the current MSU comprises a single article of manufacture.

10. The method as recited in claim 8, wherein the current MSU comprises a plurality of articles of manufacture.

11. The method as recited in claim 8, wherein the process capability index is determined based on a statistical process control (SPC) history associated with the measurement parameter.

12. A method of fabricating an integrated circuit (IC), the method comprising:
processing a semiconductor wafer in a fabrication flow having a sequence of process steps for creating at least one semiconductor die containing the IC, the semiconductor wafer forming a substrate for the IC;
after a targeted process step that adds to or subtracts from a material layer formed over the semiconductor wafer, performing a metrological operation with respect to a measurement parameter associated with the material layer, the metrological operation performed on one or more die locations of the semiconductor wafer according to a measurement plan, the metrological operation performed responsive to a determination that the semiconductor wafer is selected for measurement at the targeted process step, the determination based on a process capability index associated with the measurement parameter and a measurement history of a plurality of semiconductor wafers processed at the targeted process step;
on the condition that the metrological operation identifies the semiconductor wafer as having an out-of-specification measurement, determining that the semiconductor wafer is reworkable and adjusting one or more processing conditions of the targeted process step in response;
repeating processing of the semiconductor wafer at the targeted process step after the adjusting; and
after completing the sequence of process steps, including the targeted process step, singulating the semiconductor die containing the IC for packaging,
wherein the process capability index is distributed to account for variability of the measurement parameter from a first value that corresponds to a first sampling rate comprising 100% sampling wherein each semiconductor wafer of a batch of semiconductor wafers is sampled for measurement and a second value that corresponds to a second sampling rate comprising 50% sampling wherein every other semiconductor wafer of a batch of the semiconductor wafers is sampled for measurement.

13. The method as recited in claim 12, wherein the process capability index is determined based on a statistical process control (SPC) history associated with the measurement parameter.

14. The method as recited in claim 12, wherein the measurement parameter comprises at least one of a critical dimension (CD) variable, an overlay alignment variable, a layer thickness variable, a layer planarization variable, an etch profile variable, and an electrical parametric variable.

15. The method as recited in claim 12, wherein the out-of-specification measurement is determined based on a statistical process control (SPC) history associated with the measurement parameter.

16. The method as recited in claim 12, wherein the determination that the semiconductor wafer is selected for measurement at the targeted process step is conditionally determined upon satisfying an exclusion condition prior to executing a decision engine with respect to selecting or skipping a semiconductor wafer for measurement at the targeted process step.

17. A method of fabricating an integrated circuit (IC), the method comprising:
processing a current plurality of semiconductor wafers in a fabrication flow having a sequence of process steps including a targeted process step, wherein the targeted process step adds to or subtracts from a material layer over the semiconductor wafers;
performing a metrological operation with respect to a measurement parameter associated with the material layer, the metrological operation performed responsive to a determination that the current plurality of semiconductor wafers is selected for measurement at the targeted process step, the determination based on a process capability index associated with the measurement parameter and a measurement history of a plurality of previous process runs at the targeted process step, each previous process run comprising a corresponding plurality of semiconductor wafers;
on the condition that the metrological operation identifies at least one semiconductor wafer of the current plurality of semiconductor wafers as having an out-of-specification measurement, adjusting one or more processing conditions of the targeted process step; and
processing at least one subsequent semiconductor wafer containing the IC using the targeted process step after the adjusting,
wherein the determination that the current plurality of semiconductor wafers is selected for measurement at the targeted process step is conditionally determined upon satisfying an exclusion condition prior to executing a decision engine with respect to selecting or skipping a process run for measurement at the targeted process step.

18. A method of fabricating an integrated circuit (IC), the method comprising:
processing a semiconductor wafer in a fabrication flow having a sequence of process steps for creating at least one semiconductor die containing the IC, the semiconductor wafer forming a substrate for the IC;
after a targeted process step that adds to or subtracts from a material layer formed over the semiconductor wafer, performing a metrological operation with respect to a measurement parameter associated with the material layer, the metrological operation performed on one or more die locations of the semiconductor wafer according to a measurement plan, the metrological operation performed responsive to a determination that the semiconductor wafer is selected for measurement at the targeted process step, the determination based on a process capability index associated with the measurement parameter and a measurement history of a plurality of semiconductor wafers processed at the targeted process step;
on the condition that the metrological operation identifies the semiconductor wafer as having an out-of-specification measurement, determining that the semiconductor wafer is reworkable and adjusting one or more processing conditions of the targeted process step in response;
repeating processing of the semiconductor wafer at the targeted process step after the adjusting; and
after completing the sequence of process steps, including the targeted process step, singulating the semiconductor die containing the IC for packaging,
wherein the determination that the semiconductor wafer is selected for measurement at the targeted process step is conditionally determined upon satisfying an exclusion condition prior to executing a decision engine with respect to selecting or skipping a semiconductor wafer for measurement at the targeted process step.

* * * * *